(12) United States Patent
Miyazawa

(10) Patent No.: US 6,841,849 B2
(45) Date of Patent: Jan. 11, 2005

(54) SEMICONDUCTOR DEVICE AND METHOD OF MANUFACTURING THE SAME, CIRCUIT BOARD AND ELECTRONIC INSTRUMENT

(75) Inventor: Ikuya Miyazawa, Chino (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/703,570

(22) Filed: Nov. 10, 2003

(65) Prior Publication Data

US 2004/0155330 A1 Aug. 12, 2004

Related U.S. Application Data

(63) Continuation of application No. PCT/JP03/03301, filed on Mar. 19, 2003.

(30) Foreign Application Priority Data

Mar. 19, 2002 (JP) ........................................ 2002-076307
Jan. 15, 2003 (JP) ........................................ 2003-007276

(51) Int. Cl.[7] ............................................. H01L 29/40
(52) U.S. Cl. ...................... 257/621; 257/698; 257/690; 438/106
(58) Field of Search ............................... 257/621, 698, 257/690; 438/106

(56) References Cited

U.S. PATENT DOCUMENTS 5,767,001 A  6/1998 Bertagnolli et al. ........ 438/455

6,184,060 B1 * 2/2001 Siniaguine .................. 438/106

FOREIGN PATENT DOCUMENTS

| JP | A 60-7148 | 1/1985 |
| JP | A 60-7149 | 1/1985 |
| JP | A 2001-53218 | 2/2001 |
| JP | A 2001-326325 | 11/2001 |
| WO | WO 98/19337 | 5/1998 |

OTHER PUBLICATIONS

U.S. patent application Ser. No. 10/703,573, Miyazawa, filed Nov. 10, 2003.

* cited by examiner

Primary Examiner—David Nelms
Assistant Examiner—Tu-Tu Ho
(74) Attorney, Agent, or Firm—Oliff & Berridge, PLC

(57) ABSTRACT

A depression is formed from a first surface of a semiconductor substrate on which is formed an integrated circuit. An insulating layer is provided on the inner surface of the depression. A first conductive portion is provided on the inside of the insulating layer. A second conductive portion is formed on the inside of the insulating layer and over the first conductive portion, of a different material from the first conductive portion. The first conductive portion is exposed from a second surface of the semiconductor substrate opposite to the first surface.

32 Claims, 13 Drawing Sheets

SEMICONDUCTOR DEVICE AND METHOD OF MANUFACTURING THE SAME, CIRCUIT BOARD AND ELECTRONIC INSTRUMENT

CROSS REFERENCE TO RELATED APPLICATION

This application is a continuation of International Patent Application No. PCT/JP03/03301, having an international filing date of Mar. 19, 2003, which designated the United States, the entirety of which is incorporated herein by reference. Japanese Patent Application No. 2002-76307 filed on Mar. 19, 2002 and Japanese Patent Application No. 2003-7276 filed on Jan. 15, 2003 are also incorporated herein by reference in their entirety.

BACKGROUND OF THE INVENTION

The present invention relates to a semiconductor device, a method of manufacturing the semiconductor device, a circuit board and an electronic instrument.

A semiconductor device for three-dimensional mounting has been developed. It is known to form electrodes penetrating a semiconductor chip, to enable three-dimensional mounting. If the extremity of a penetrating electrode is formed of a material which is not easily oxidized, the electrical connection characteristics are improved, but there are difficulties in forming the extremity only of a different material from the other parts. Since a material which is not easily oxidized is expensive, it is not practical to form the whole penetrating electrode of such a material.

BRIEF SUMMARY OF THE INVENTION

The present invention solves the existing problems, and has as its object the expansion of the range of choice of material for a penetrating electrode.

(1) According to a first aspect of the present invention, there is provided a method of manufacturing a semiconductor device comprising:

(a) forming a depression from a first surface of a semiconductor substrate in which an integrated circuit is formed;

(b) providing an insulating layer on an inner surface of the depression;

(c) providing a first conductive portion on the inside of the insulating layer;

(d) forming a second conductive portion on the inside of the insulating layer and over the first conductive portion, being of a different material from the first conductive portion; and (e) exposing the first conductive portion from a second surface of the semiconductor substrate opposite to the first surface. According to the present invention, the exposed first conductive portion is formed of a different material from the second conductive portion. Therefore, materials of the first and second conductive portions can be selected bearing in mind the effect of the exposure, the cost, and so forth.

(2) In this method of manufacturing a semiconductor device, the step (e) may include polishing the second surface of the semiconductor substrate.

(3) In this method of manufacturing a semiconductor device, the second surface may be etched so that the first conductive portion projects in the step (e).

(4) In this method of manufacturing a semiconductor device, the first conductive portion may be less easily oxidized than the second conductive portion.

(5) In this method of manufacturing a semiconductor device, the first conductive portion may be formed of gold, and at least a center portion of the second conductive portion may be formed of copper.

(6) In this method of manufacturing a semiconductor device, the material of the first conductive portion may be put in the depression by an ink jet method in the step (c).

(7) In this method of manufacturing a semiconductor device, the semiconductor substrate may be a semiconductor wafer having a plurality of the integrated circuits, the depression being formed for each of the integrated circuits; and this method may further comprise cutting the semiconductor substrate.

(8) In this method of manufacturing a semiconductor device, the step of cutting the semiconductor substrate may include:

forming a groove in the first surface, along a cutting line of the semiconductor substrate; and removing a bottom portion of the groove from the second surface so that the groove becomes a slit.

(9) In this method of manufacturing a semiconductor device, the groove may be formed by cutting.

(10) In this method of manufacturing a semiconductor device, the groove may be formed by etching.

(11) In this method of manufacturing a semiconductor device, the groove may be formed in the same process as the depression in the step (a).

(12) In this method of manufacturing a semiconductor device, the groove may be formed to be deeper than the depression; and the bottom portion of the groove may be removed by the polishing of the second surface of the semiconductor substrate.

(13) In this method of manufacturing a semiconductor device, the insulating layer may be provided also on the inner surface of the groove in the step (b).

(14) In this method of manufacturing a semiconductor device, the step (e) may include:

($e_1$) etching the second surface of the semiconductor substrate with a first etchants, having characteristics such that the etching amount with respect to the semiconductor substrate is greater than the etching amount with respect to the insulating layer, to cause the first conductive portion to project while covered by the insulating layer; and ($e_2$) etching at least a part of the insulating layer formed on a bottom surface of the depression with a second etchants, having characteristics such that at least the insulating layer is etched without forming a residue on the first conductive portion, to expose the first conductive portion;

wherein part of the insulating layer formed on the bottom portion of the groove may be caused to project from the second surface in the step ($e_1$); and wherein the part of the insulating layer formed on the bottom portion of the groove may be etched and removed by means of the second etchants in the step ($e_2$).

(15) In this method of manufacturing a semiconductor device, the step of removing the bottom portion of the groove may be carried out in a state that a material of the semiconductor substrate is exposed within the groove.

(16) In this method of manufacturing a semiconductor device, the step (e) may include:

($e_1$) etching the second surface of the semiconductor substrate with a first etchants, having characteristics such that the etching amount with respect to the semiconductor substrate is greater than the etching amount with respect to the insulating layer, to cause the first conductive portion to project while covered by the insulating layer; and ($e_2$) etching at least a part of the insulating layer formed on a bottom surface of the depression with a second etchants, having characteristics such that at least the insulating layer is etched without forming a residue on the first conductive portion, to expose the first conductive portion; and the bottom portion of the groove formed by a part of the semiconductor substrate may be etched and removed by means of the first etchants in the step ($e_1$).

(17) In this method of manufacturing a semiconductor device, the step of cutting the semiconductor substrate may be carried out with a protective sheet adhered to the first surface of the semiconductor substrate, so that a plurality of semiconductor chips obtained by cutting do not fall apart.

(18) In this method of manufacturing a semiconductor device, the groove may be formed only in regions sectioning the semiconductor substrate into a plurality of semiconductor chips having the plurality of integrated circuits.

(19) According to a second aspect of the present invention, there is provided a method of manufacturing a semiconductor device, comprising:

laminating a plurality of semiconductor devices manufactured by the above-described method; and making electrical connections between the semiconductor devices through the conductive portions.

(20) According to a third aspect of the present invention, there is provided a semiconductor device manufactured by the above-described method.

(21) According to a fourth aspect of the present invention, there is provided a semiconductor device comprising:

a semiconductor substrate having an electrode which is electrically connected to an integrated circuit and provided on a first surface of the semiconductor substrate, and also having a penetrating hole;

an insulating layer provided on an inner surface of the penetrating hole; and first and second conductive portions laminated on the inside of the insulating layer in the thickness direction of the semiconductor substrate, wherein the first and second conductive portions are formed of different materials; and wherein the first conductive portion is exposed from a second surface of the semiconductor substrate opposite to the first surface. According to the present invention, the exposed first conductive portion is formed of a different material from the second conductive portion. Therefore, materials of the first and second conductive portions can be selected bearing in mind the effect of the exposure, the cost, and so forth.

(22) In this semiconductor device, the first conductive portion may project from the second surface.

(23) In this semiconductor device, the first conductive portion may be less easily oxidized than the second conductive portion.

(24) In this semiconductor device, the first conductive portion may be formed of gold, and at least a center portion of the second conductive portion may be formed of copper.

(25) According to a fifth aspect of the present invention, there is provided a semiconductor device comprising:

a plurality of the above-described semiconductor devices, wherein the semiconductor devices are laminated, and electrical connection between the semiconductor devices is achieved through the conductive portions.

(26) According to a sixth aspect of the present invention, there is provided a circuit board on which is mounted the above-described semiconductor device.

(27) According to a seventh aspect of the present invention, there is provided an electronic instrument comprising the above-described semiconductor device.

DETAILED DESCRIPTION OF THE EMBODIMENT

The present invention is now described in terms of a number of embodiments, with reference to the drawings.

First Embodiment

Figure 1A:
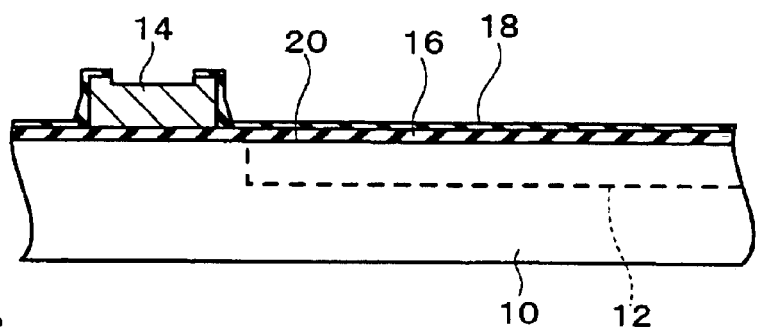
FIGS. 1A to 1C are diagrams for illustrating the method of manufacturing a semiconductor device according to a first embodiment of the present invention.

FIG. 1A to FIG. 4B show a first embodiment of the method of manufacturing a semiconductor device to which the present invention is applied. In this embodiment, a semiconductor substrate 10 is used. The semiconductor substrate 10 shown in FIG. 1A is a semiconductor wafer, but it may be a semiconductor chip. On the semiconductor substrate 10 is formed at least one (a plurality on a semiconductor wafer; one on a semiconductor chip) integrated circuit (for example, a circuit comprising transistors or memory) 12. On the semiconductor substrate 10 are formed a plurality of electrodes (for example, pads) 14. Each electrode 14 is electrically connected to the integrated circuit 12. The electrodes 14 may be formed of aluminum. The surface form of the electrodes 14 is not particularly restricted, but may be rectangular. When the semiconductor substrate 10 is a semiconductor wafer, in each of the regions for the plurality of semiconductor chips, (one group of) two or more electrodes 14 are formed.

On the semiconductor substrate 10 are formed passivation films 16 and 18, of a single layer or more layers. The passivation films 16 and 18 can be formed of, for example, $SiO_2$, SIN, polyimide resin, or the like. In the example shown in FIG. 1A, on the passivation film 16, the electrodes 14, and interconnecting lines (not shown in the drawings) connecting the integrated circuit 12 and electrodes 14 are formed. The other passivation film 18 is formed so as to avoid at least a part of the surface of the electrodes 14. After forming the passivation film 18 to cover the surface of the electrodes 14, a part may be etched to expose a part of the electrodes 14. For the etching, either dry etching or wet etching may be applied. When etching the passivation film 18, the surface of the electrodes 14 may be etched.

Figure 1B:
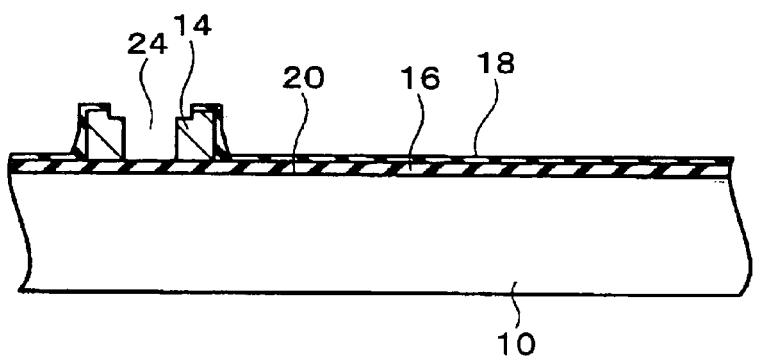

In this embodiment, in the semiconductor substrate 10, a depression 22 (see FIG. 1C) is formed from a first surface 20 thereof. The first surface 20 is the surface on which the electrodes 14 are formed. The depression 22 is formed to avoid the elements and interconnecting lines of the integrated circuit 12. As shown in FIG. 1B, a penetrating hole 24 may be formed in the electrodes 14. To form the penetrating hole 24, etching (dry etching or wet etching) may be applied. The etching may be carried out after using a lithography process to form a patterned resist (not shown in the drawings). When the passivation film 16 is formed beneath the electrodes 14, a penetrating hole 26 (see FIG. 1C) is also formed therein. When the etching of the electrodes 14 is stopped by the passivation film 16, for the formation of the penetrating hole 26 the etchants used for etching the electrodes 14 may be replaced by a different etchants. In this case, a patterned resist (not shown in the drawings) may be formed by a lithography process.

Figure 1C:
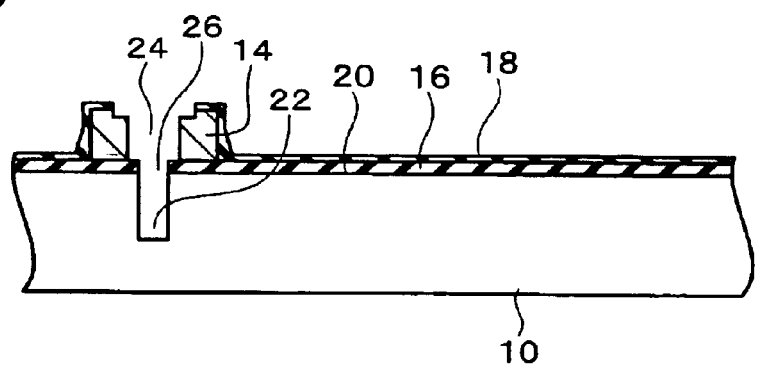

As shown in FIG. 1C, the depression 22 is formed in the semiconductor substrate 10 so as to communicate with the penetrating hole 24 (and penetrating hole 26). The penetrating hole 24 (and penetrating hole 26) and depression 22 can also be referred to collectively as a depression. For the formation of the depression 22, etching (dry etching or wet etching) can be applied. Etching may be carried out after forming a patterned resist (not shown in the drawings) by a lithography process. Alternatively, for the formation of the depression 22, a laser (for example, a $CO_2$ laser, a YANG laser, or the like) may be used. The laser may be applied to the formation of the penetrating holes 24 and 26. The depression 22 and penetrating holes 24 and 26 may also be formed together by the use of a single etchants or laser.

Figure 2A:
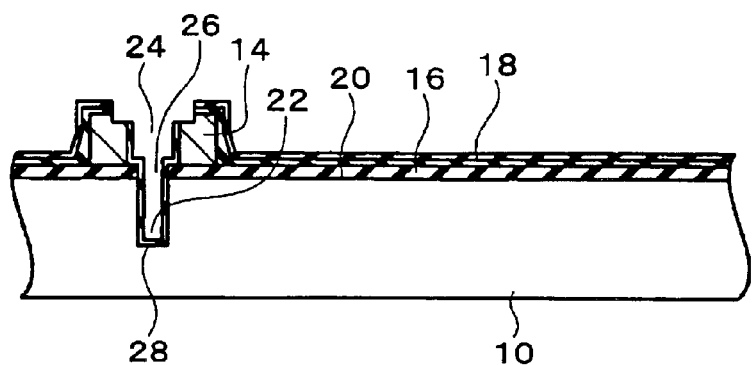
FIGS. 2A to 2C are diagrams for illustrating the method of manufacturing a semiconductor device according to the first embodiment of the present invention.

As shown in FIG. 2A, on the inner surface of the depression 22, an insulating layer 28 is formed. The insulating layer 28 may be an oxidation film. For example, if the material of the semiconductor substrate 10 is silicon, the insulating layer 28 may be of $SiO_2$ or SIN. The insulating layer 28 is formed on the inner wall of the depression 22. The insulating layer 28 may be formed on the bottom surface of the depression 22. However, the insulating layer 28 is formed so as not to fill in the depression 22. That is to say, a depression is formed by the insulating layer 28. The insulating layer 28 may be formed on the inner wall of the penetrating hole 26 in the passivation film 16. The insulating layer 28 may be formed over the passivation film 18.

The insulating layer 28 may be formed on the inner wall of the penetrating hole 24 in the electrodes 14. The insulating layer 28 is formed to avoid a part of the electrodes 14 (for example, the top surface thereof). The insulating layer 28 may be formed to cover the whole surface of the electrodes 14, and then by partial etching (dry etching or wet etching), a part of the electrodes 14 exposed. The etching may be carried out after forming a patterned resist (not shown in the drawings) by a lithography process.

Figure 2B:
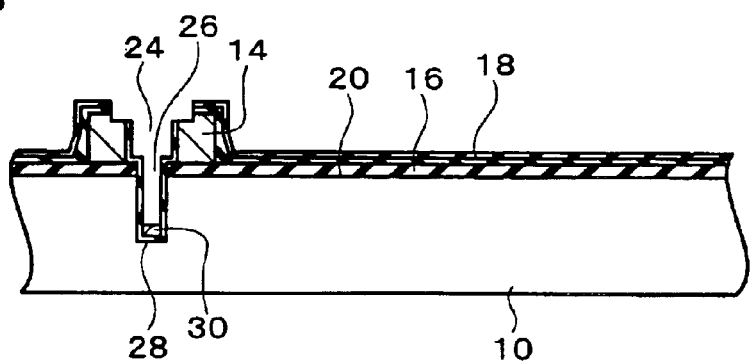

As shown in FIG. 2B, on the inside of the insulating layer 28, a first conductive portion 30 is provided. The first conductive portion 30 is formed of, for example, gold. The first conductive portion 30 may be of a material less easily oxidized than the second conductive portion 32 described below. The first conductive portion 30 may be provided only in the bottom of the depression 22 (or a depression formed by the insulating layer 28). The first conductive portion 30 may be formed by depositing the material thereof (for example, a solution including the material of which the first conductive portion 30 is constituted) in the depression 22 ink jet method. Since the insulating layer 28 is interposed between the inner surface of the depression 22 and the first conductive portion 30, electrical connection between the two is prevented.

Figure 2C:
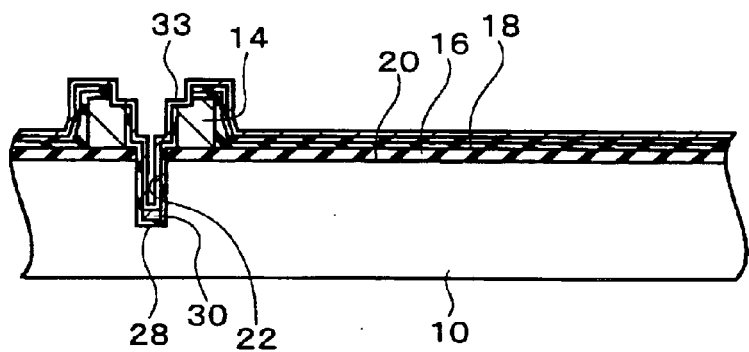
Figure 3A:
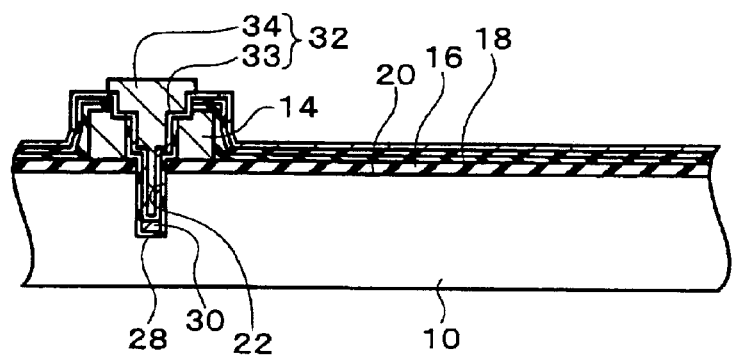
FIGS. 3A to 3C are diagrams for illustrating the method of manufacturing a semiconductor device according to the first embodiment of the present invention.
Figure 3B:
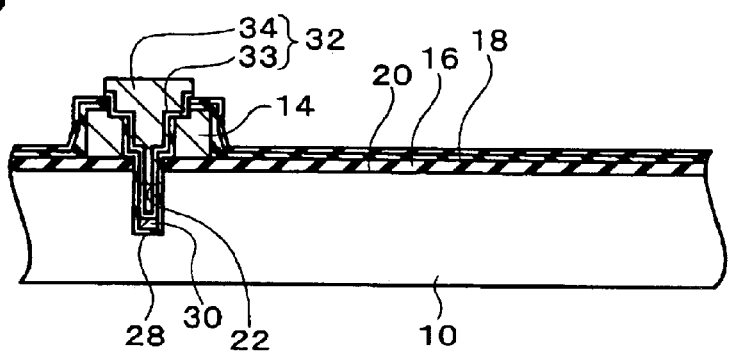

Next, a second conductive portion 32 (See FIG. 3A) is provided, inside the insulating layer 28 and above the first conductive portion 30. The first and second conductive portions 30 and 32 may be electrically connected, and in intimate contact. The second conductive portion 32 is formed of a different material from the first conductive portion 30 (for example, copper, tungsten, or the like). After an outer layer 33 of the second conductive portion 32 is formed as shown in FIG. 2C, a center portion 34 thereof may be formed as shown in FIG. 3A. The center portion 34 can be formed of any of copper, tungsten, doped polysilicon (for example, low temperature polysilicon). The outer layer 33 may include at least a barrier layer. The barrier layer prevents the material of the center portion 34 or of the seed layer described next from diffusing into the semiconductor substrate 10 (for example silicon). The barrier layer may be formed of a different material from the center portion 34 (for example, TAW, TIN, or TAN). If the center portion 34 is formed by electroplating, the outer layer 33 may include a seed layer. The seed layer is formed after forming the barrier layer. The seed layer is formed of the same material (for example copper) as the center portion 34. It should be noted that the second conductive portion 32 (at least the center portion 34 thereof) may be formed by electroless plating or an ink jet method.

Figure 16A:
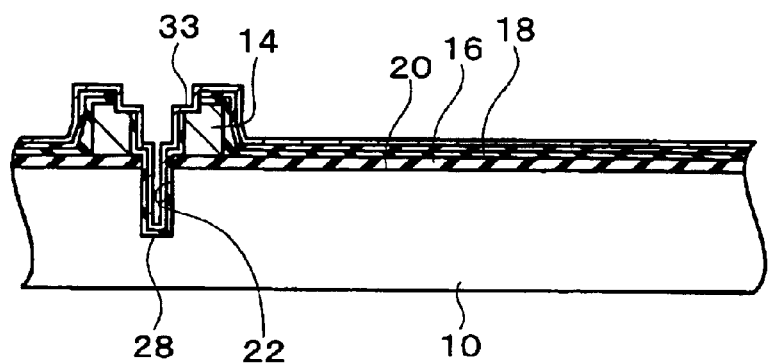
FIGS. 16A to 16B are diagrams showing a modification of the semiconductor device according to the first embodiment of the present invention.
Figure 16B:
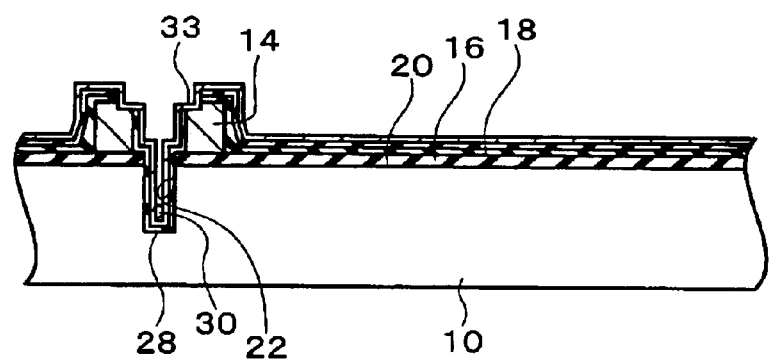

It should be noted that the first conductive portion 30 may, as described above, be formed after the insulating layer 28 is formed and before the outer layer 33 is formed, but equally the insulating layer 28 and outer layer 33 may be formed (See FIG. 16A), and thereafter the first conductive portion 30 may be formed (see FIG. 16B).

As shown in FIGS. 2C and 3A, when the outer layer 33 is also formed over the passivation film 18, as shown in FIG.

3B, the part of the outer layer 33 over the passivation film 18 is etched. The second conductive portion 32 can be provided by forming the center portion 34 after the outer layer 33 is formed. A part of the second conductive portion 32 is positioned within the depression 22 in the semiconductor substrate 10. Between the inner surface of the depression 22 and the second conductive portion 32 is interposed the insulating layer 28, and therefore the two are electrically isolated. The second conductive portion 32 is electrically connected to the electrodes 14. For example, a portion of the electrodes 14 exposed from the insulating layer 28 may contact the second conductive portion 32. A part of the second conductive portion 32 may be positioned over the passivation film 18. The second conductive portion 32 may be provided only within the region of the electrodes 14. The second conductive portion 32 may project, at least above the depression 22. For example, the second conductive portion 32 may project from the passivation film 18.

It should be noted that as a modification, the center portion 34 may be formed with the outer layer 33 remaining on the passivation film 18. In that case, since a layer continuous with the center portion 34 is formed over the passivation film 18, this layer is etched.

Figure 3C:
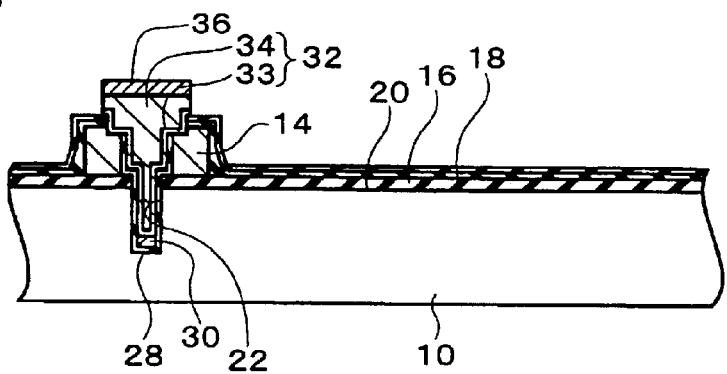

As shown in FIG. 3C, over the second conductive portion 32, a solder layer 36 may be provided. The solder layer 36 may be formed of either of soft solder or hard solder. The solder layer 36 may be formed by covering regions other than the second conductive portion 32 with a resist. By the above process, bumps can be formed by the second conductive portion 32, or with the addition of the solder layer 36.

Figure 4A:
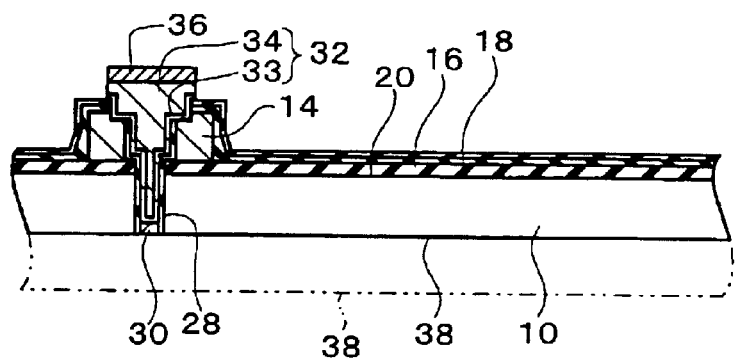
FIGS. 4A to 4B are diagrams for illustrating the method of manufacturing a semiconductor device according to the first embodiment of the present invention.

In this embodiment, as shown in FIG. 4A, from a second surface of the semiconductor substrate 10 (the surface on the opposite side to the first surface 20) 38, the first conductive portion 30 is exposed. For example, by at least one of mechanical polishing and chemical polishing, the second surface 38 of the semiconductor substrate 10 may be removed. At this point, a part of the first conductive portion 30 may be removed.

Figure 4B:
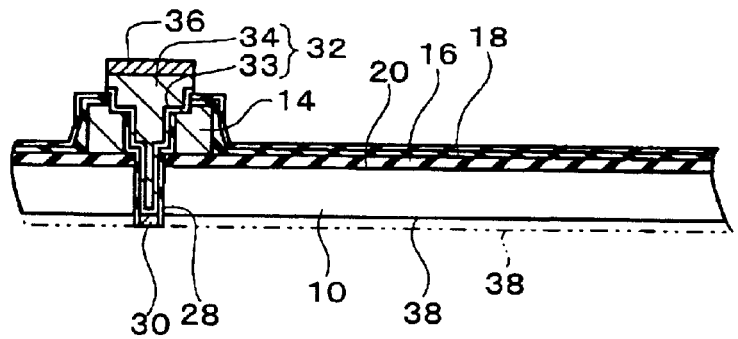

As shown in FIG. 4B, the second surface 38 may be etched in order that the first conductive portion 30 projects. For the etching, $SF_6$, $CF_4$, or $Cl_2$ gas may be used. The etching may be carried out using a dry etching device. When the first conductive portion 30 is formed of gold, it is difficult for the constituent molecules of the etching gas to adhere to the exposed surface, which is also not easily oxidized, and therefore the electrical connection is satisfactory.

It should be noted that in at least one step in FIGS. 4A and 4B, a reinforcing member of, for example, resin layer or resin tape may be provided on the first surface 20 of the semiconductor substrate 10.

By the above process, the first conductive portion 30 can be caused to project from the second surface 38 of the semiconductor substrate 10. The projecting first conductive portion 30 forms a projecting electrode. The first and second conductive portions 30 and 32 also form penetrating electrodes of the first and second surfaces 20 and 38. According to this embodiment, the exposed first conductive portion 30 is formed of a different material from the second conductive portion 32. Therefore, the material of the first and second conductive portions 30 and 32 can be selected considering the effect of being exposed, and cost and so on.

Figure 5:
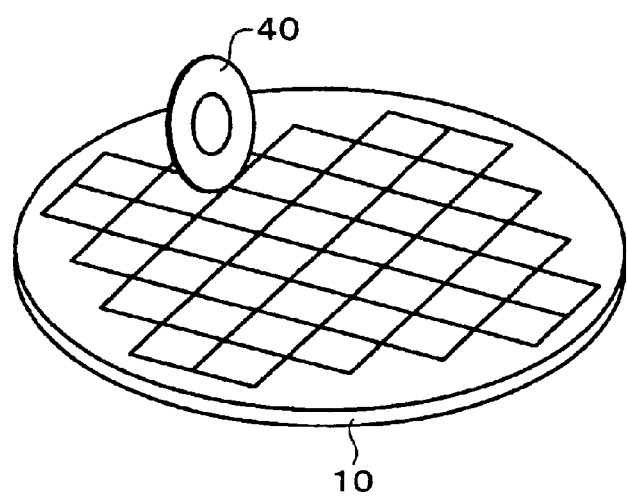
FIG. 5 is a diagram for illustrating the method of manufacturing a semiconductor device according to the first embodiment of the present invention.

As shown in FIG. 5, when the semiconductor substrate 10 is a semiconductor wafer, concavities 22 may be formed corresponding to individual integrated circuits 12 (See FIG. 1A), and the semiconductor substrate 10 may be cut (for example, by dicing). For the cutting, a cutter (for example, a dicer) 40 or laser (for example, a $CO_2$ laser, YANG laser, or the like) may be used.

By the above process, a semiconductor device can be manufactured. The semiconductor device has electrodes 14 electrically connection to the integrated circuit 12 on the first surface 20, and has a semiconductor substrate in which the penetrating hole is formed. The semiconductor device has the insulating layer 28 provided on the inner surface of the penetrating hole. The semiconductor device has first and second conductive portions 30 and 32 on the inside of the insulating layer 28, laminated in the thickness direction of the semiconductor substrate 10. Other components can be obtained according to the above described method.

Figure 6:
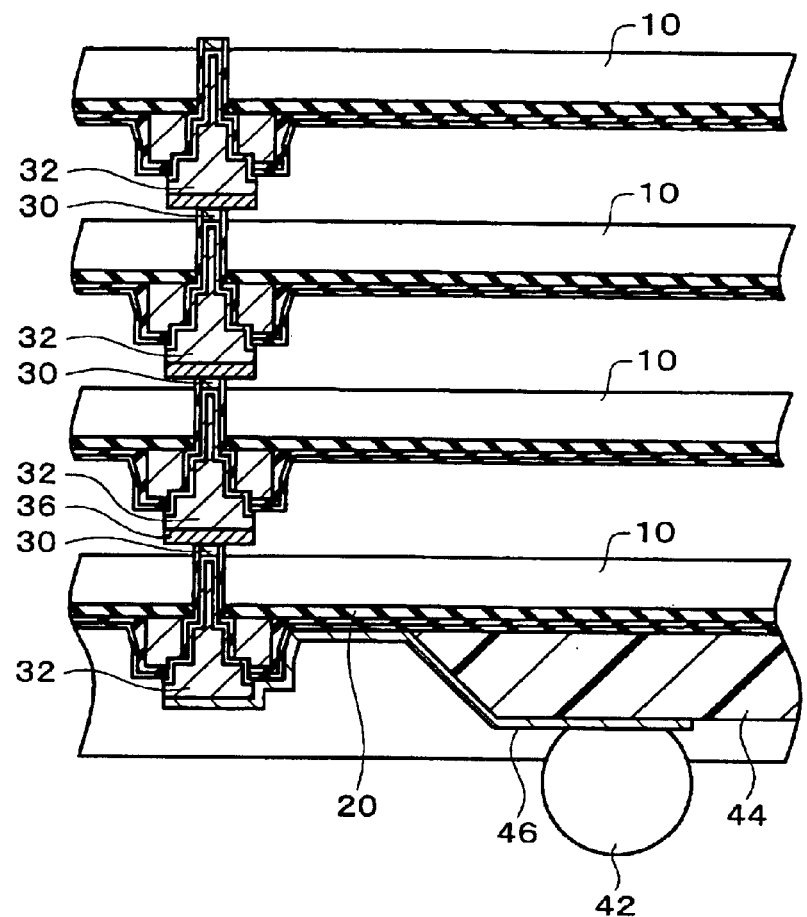
FIG. 6 is a diagram for illustrating the method of manufacturing a semiconductor device according to the first embodiment of the present invention.

As shown in FIG. 6, a plurality of semiconductor device manufactured by the above described method may be laminated, and electrical connection therebetween may be achieved through respective first conductive portions 30. This embodiment is effective for carrying out such a three-dimensional mounting. The semiconductor device shown in FIG. 6 has a plurality of semiconductor substrates 10. In the direction of the first surface 20, the outermost positioned (in FIG. 6, the lowest) semiconductor substrate 10 has external terminals (for example, solder balls) 42. The external terminals 42 are provided on interconnecting lines 46 formed over a resin layer (for example, a stress relieving layer) 44. The interconnecting lines 46 are connected to the second conductive portion 32 on the first surface 20.

Figure 7:
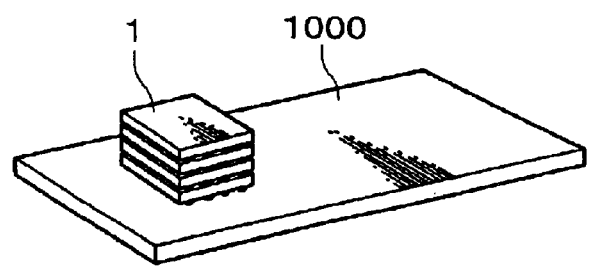
FIG. 7 is a diagram showing a circuit board according to the first embodiment of the present invention.
Figure 8:
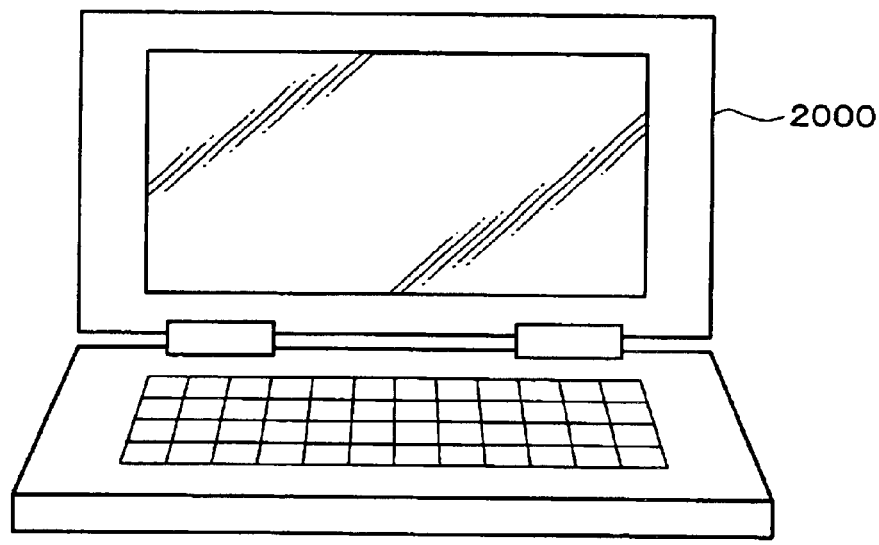
FIG. 8 is a diagram showing an electronic instrument according to the first embodiment of the present invention.
Figure 9:
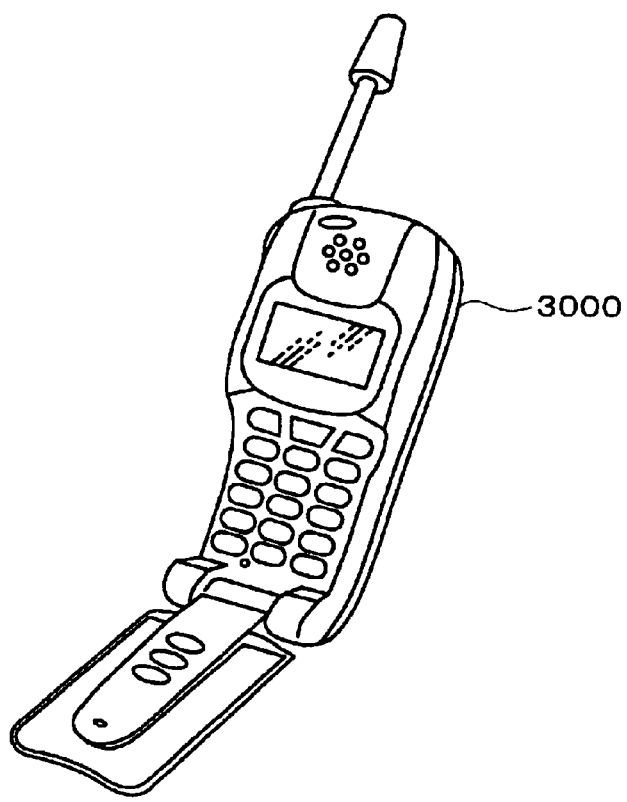
FIG. 9 illustrates a first embodiment of an electronic instrument of the present invention.

In FIG. 7 is shown a circuit board 1000 on which is mounted a semiconductor device 1, formed of a laminated plurality of semiconductor chips. The plurality of semiconductor chips is electrically connected by the above described first conductive portion 30. As an electronic instrument having the above described semiconductor device, FIG. 8 shows a notebook personal computer 2000, and FIG. 9 shows a mobile telephone 3000.

Second Embodiment

Figure 10A:
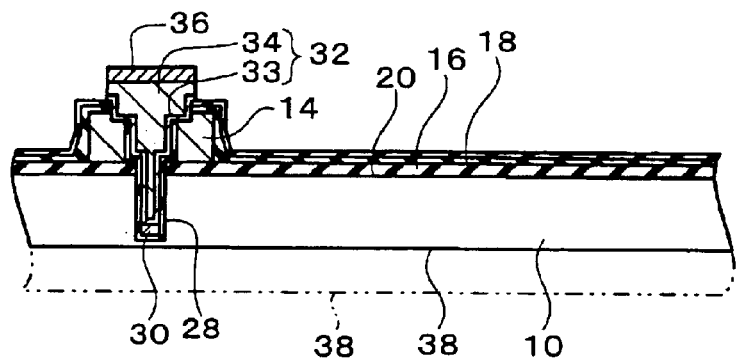
FIGS. 10A to 10C are diagrams for illustrating the method of manufacturing a semiconductor device according to a second embodiment of the present invention.
Figure 10B:
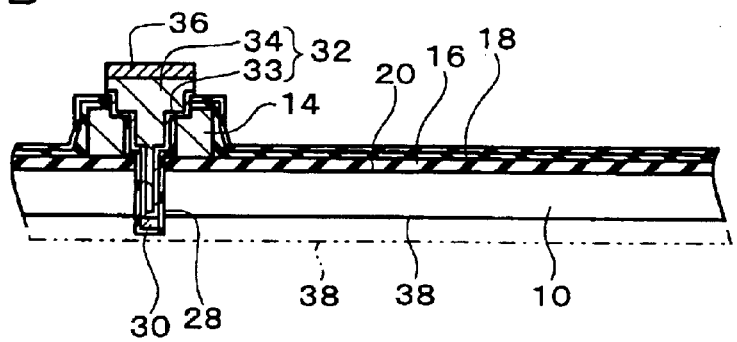
Figure 10C:
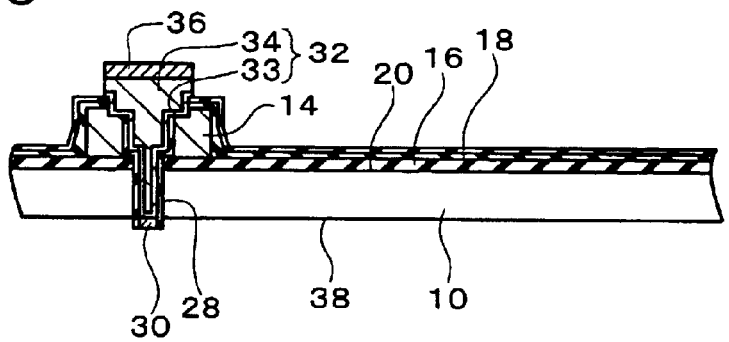

FIGS. 10A to 10C illustrate a second embodiment, being a modification of the process shown in FIGS. 4A to 4B. In this embodiment, as shown in FIG. 10A, the second surface of the semiconductor substrate 10 (the surface on the opposite side to the first surface 20) 38 is removed, for example by at least one method of mechanical polishing or cutting and chemical polishing or cutting. This process is carried out to a point before exposing the insulating layer 28 formed in the depression 22. It should be noted that the process shown in FIG. 10A may be omitted, and next the process in FIG. 10B carried out.

As shown in FIG. 10B, the second surface 38 of the semiconductor substrate 10 is etched so that the insulating layer 28 is exposed. The second surface 38 of the semiconductor substrate 10 is etched so that the first conductive portion 30 projects while covered by the insulating layer 28. The etching is carried out with a first etchants whose properties are such as to yield a greater etching amount with respect to the semiconductor substrate (for example, a silicon base material) 10 than with respect to the insulating layer (for example, formed of $SiO_2$) 28. The first etchants may be $SF_6$, $CF_4$, or $Cl_2$ gas. The etching may be carried out using a dry etching device. Alternatively, first etchants may be a mixture of hydrofluoric acid and nitric acid, or a mixture of hydrofluoric acid, nitric acid, and acetic acid.

As shown in FIG. 10C, at least the portion of the insulating layer 28 formed on the bottom surface of the depression 22 is etched. Then the first conductive portion 30 is exposed. The extreme surface of the first conductive portion 30 may be exposed, and the peripheral surface of the extremity of the first conductive portion 30 covered by the insulating layer 28. The outer layer 33 (for example, a barrier layer) of the first conductive portion 30 may also be etched. The etching may be carried out with a second etchants of characteristics such as to etch at least the insulating layer 28 without forming residues on the first conductive portion 30. For the second etchants may be used an etchants which does not react (or has little reaction) with the material of the first conductive portion 30. The second etchants may be a mixture of argon and $CF_4$ gas, or a mixture of $O_2$ and $CF_4$ gas. The etching may be carried out using a dry etching device. Alternatively, the second etchants may be liquid hydrofluoric acid, or a liquid mixture of hydrofluoric acid and ammonium fluoride. The etching by the second etchants may have an etching rate with respect to the semiconductor substrate 10 which is slower than etching by the first etchants. According to this example, when the first conductive portion 30 is exposed from the insulating layer 28, no residues are left on the first conductive portion 30, and therefore a high quality penetrating electrode can be formed.

Third Embodiment

Figure 11A:
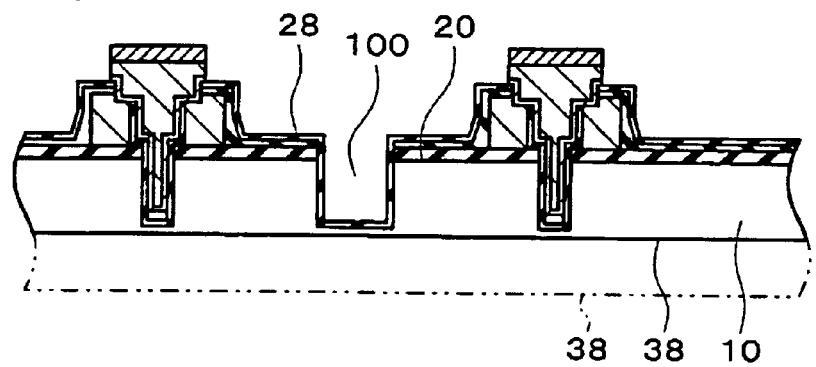
FIGS. 11A to 11C are diagrams for illustrating the method of manufacturing a semiconductor device according to a third embodiment of the present invention.
Figure 11B:
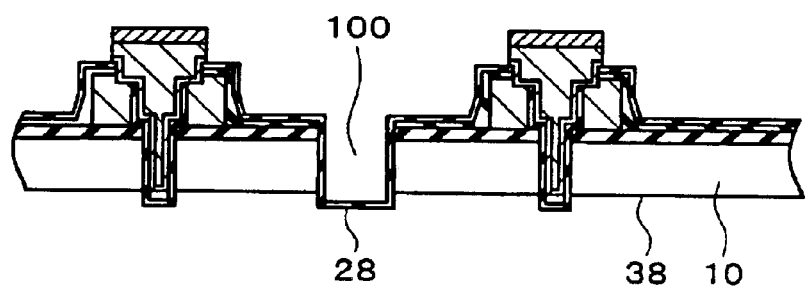
Figure 11C:
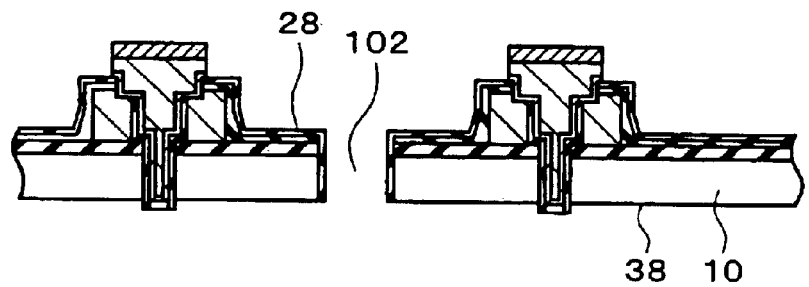

FIGS. 11A to 11C show the third embodiment of the method of manufacturing a semiconductor device to which the present invention is applied. In this embodiment, a groove 100 is formed in the semiconductor substrate 10 (more precisely, in the first surface 20 thereof). The groove 100 is formed along the cutting line of the semiconductor substrate 10. The groove 100 may be formed by cutting, or may be formed by etching. The groove 100 may be formed in the step of forming the depression 22 shown in FIG. 1C, with the same process (for example, at the same time) as the depression 22. The insulating layer 28 may be provided within the groove 100. The groove 100 may be of substantially the same depth as the depression 22, or may be deeper than the depression 22, or may be more shallow than the depression 22.

Thereafter, the process described in FIGS. 10A to 10C in the second embodiment is carried out. FIGS. 11A to 11C show the components in the vicinity of the groove 100 when the respective steps shown in FIGS. 10A to 10C are carried out. For example, the process shown in FIG. 10A is carried out, and the second surface 38 of the semiconductor substrate 10 is polished to a point short of the insulating layer 28 (see FIG. 11A). The process shown in FIG. 10B is carried out, as shown in FIG. 11B, and the insulating layer 28 formed at the bottom of the groove 100 is caused to project from the second surface 38.

Then the process shown in FIG. 10C is carried out, as shown in FIG. 11C, and by means of the second etchants, the insulating layer 28 formed at the bottom of the groove 100 is etched and removed. In this way, the bottom portion of the groove 100 is removed from the second surface, and the groove 100 becomes a slit 102. That is to say, the semiconductor substrate 10 is cut along the groove 100.

According to this embodiment, the semiconductor substrate 10 can be cut simply. Since final cutting of the semiconductor substrate 10 is carried out by means of the second etchants, chipping is not likely to occur. Furthermore, in this embodiment, since the insulating layer 28 is formed within the groove 100, the semiconductor chip has the insulating layer 28 on the edge surface. Therefore, this semiconductor chip is not susceptible to edge shorting. Other details are as described in the first and second embodiments.

Fourth Embodiment

Figure 12A:
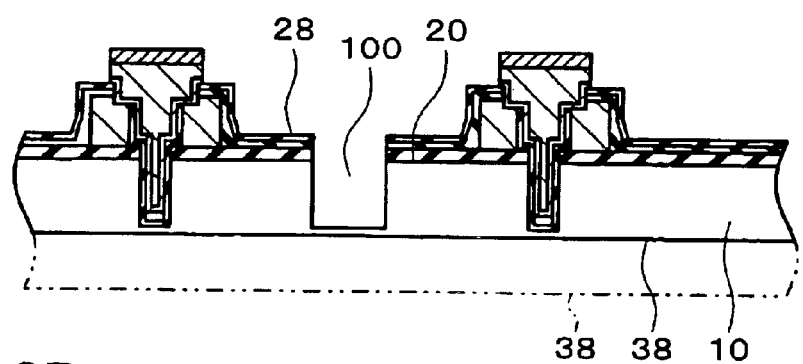
FIGS. 12A to 12B are diagrams for illustrating the method of manufacturing a semiconductor device according to a fourth embodiment of the present invention.
Figure 12B:
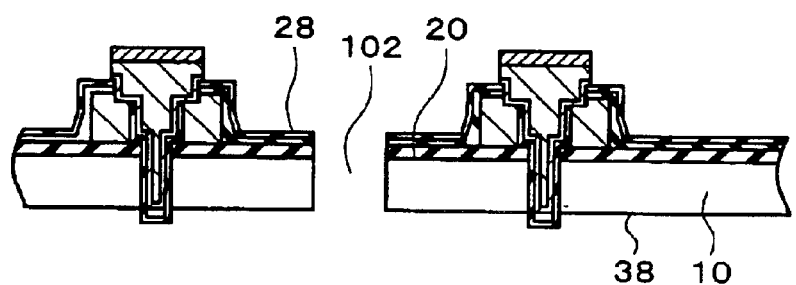

FIGS. 12A to 12B show the fourth embodiment of the method of manufacturing a semiconductor device to which the present invention is applied. In this embodiment, as shown in FIG. 12A, the process of removing the bottom portion of the groove 100 is carried out with the material of the semiconductor substrate 10 exposed within the groove 100. For example, after carrying out the process of forming the insulating layer 28 shown in FIG. 2A within the depression 22, the groove 100 may be formed, and in order that the insulating layer 28 is not attached, a resist or the like may be provided within the groove 100, or the insulating layer 28 which has entered the groove 100 may be removed. Other details are as described in the third embodiment.

In this embodiment, the process of FIG. 10B described in the second embodiment is carried out, and by means of the first etchants, the bottom portion of the groove 100 formed by a part of the semiconductor substrate 10 is etched and removed. In this way, as shown in FIG. 12B, the bottom portion of the groove 100 is removed from the second surface, and the groove 100 becomes the slit 102. That is to say, the semiconductor substrate 10 is cut along the groove 100. Other details are as described in the first, second, and third embodiments.

Fifth Embodiment

Figure 13A:
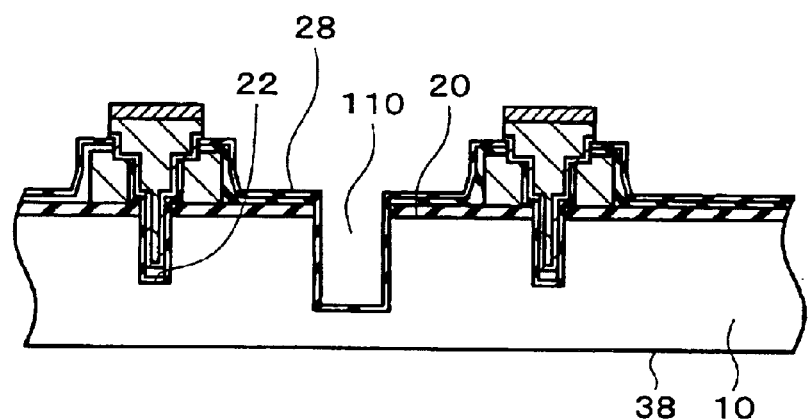
FIGS. 13A to 13B are diagrams for illustrating the method of manufacturing a semiconductor device according to a fifth embodiment of the present invention.
Figure 13B:
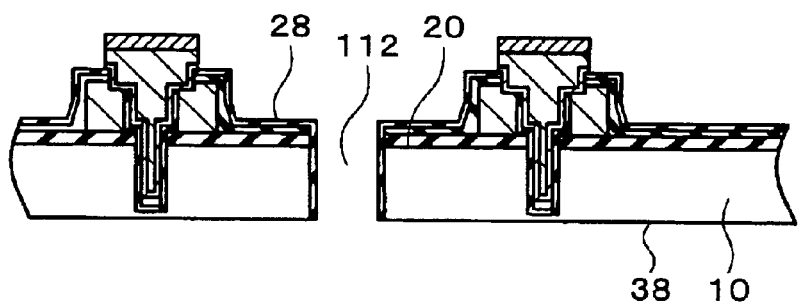

FIGS. 13A to 13B show the fifth embodiment of the method of manufacturing a semiconductor device to which the present invention is applied. In this embodiment, as shown in FIG. 13A, a groove 110 is formed to be deeper than the depression 22. The groove 110 deeper than the depression 22 can be formed easily, exploiting the etching characteristics (the property of etching deeper in a wider spaces).

Then as shown in FIG. 13B, by polishing the second surface 38 of the semiconductor substrate 10 (refer to the description relating to FIG. 4A), the bottom portion of the groove 110 is removed. In this way, the bottom portion of the groove 110 is removed from the second surface, and the groove 110 becomes a slit 112. That is to say, the semiconductor substrate 10 is cut along the groove 110. Other details are as described in the first, second, third, and fourth embodiments. In this embodiment, the semiconductor substrate 10 is cut while the insulating layer 28 is formed within the groove 110, but the semiconductor substrate 10 may equally be cut while the material of the semiconductor substrate 10 is exposed within the groove 10.

Sixth Embodiment

Figure 14:
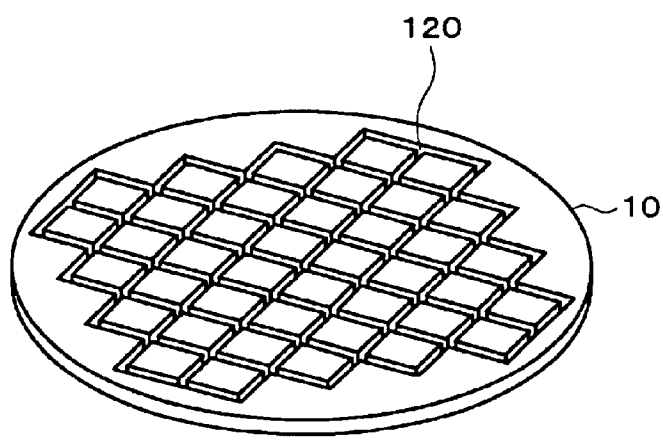
FIG. 14 is a diagram for illustrating the method of manufacturing a semiconductor device according to a sixth embodiment of the present invention.

FIG. 14 shows the sixth embodiment of the method of manufacturing a semiconductor device to which the present invention is applied. The content of this embodiment can be applied to any from the third to the fifth embodiments. In this embodiment, a groove 120 is formed only in regions delineating a plurality of semiconductor chips having a plurality of integrated circuits 12 (See FIG. 1A). By this means, parts of the semiconductor substrate 10 that are not needed (for example, an outer peripheral portion) do not become separated, and damage to the semiconductor chip forming the product can be prevented.

Seventh Embodiment

Figure 15:
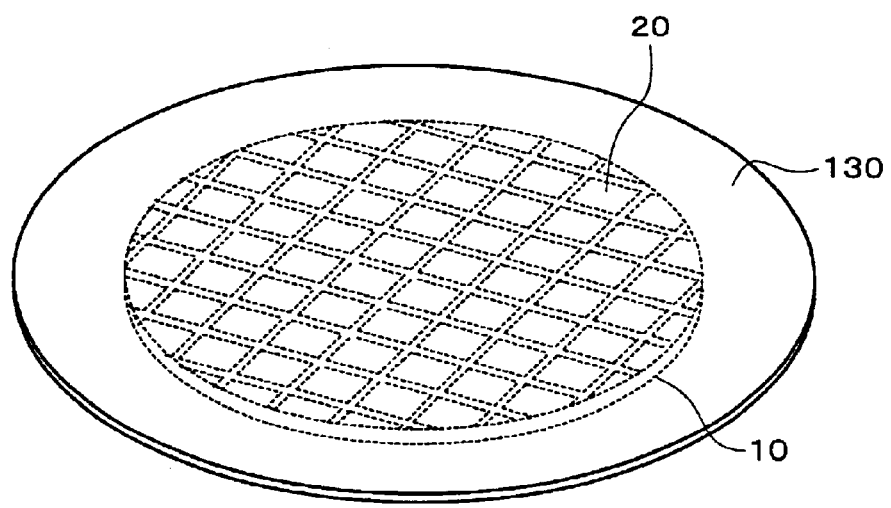
FIG. 15 is a diagram for illustrating the method of manufacturing a semiconductor device according to a seventh embodiment of the present invention.

FIG. 15 shows the seventh embodiment of the method of manufacturing a semiconductor device to which the present invention is applied. In this embodiment, the step of cutting the semiconductor substrate 10 is carried out after attaching a protective sheet 130 to the first surface 20 of the semiconductor substrate 10. The protective sheet 130 may be an adhesive tape or adhesive sheet. By means of this, even when the semiconductor substrate 10 is cut, the plurality of semiconductor chips does not fall apart. The content of this embodiment can be applied to any from the first to the sixth embodiments.

The present invention is not limited to the above-described embodiments, and various modifications can be made. For example, the present invention includes various other configurations substantially the same as the configurations described in the embodiments (in function, method and effect, or in objective and effect, for example). The present invention also includes a configuration in which an unsubstantial portion in the described embodiments is replaced. The present invention also includes a configuration having the same effects as the configurations described in the embodiments, or a configuration able to achieve the same objective. Further, the present invention includes a configuration in which a publicly known technique is added to the configurations in the embodiments.

What is claimed is:

1. A method of manufacturing a semiconductor device comprising:
   (a) forming a depression from a first surface of a semiconductor substrate in which an integrated circuit is formed;
   (b) providing an insulating layer on an inner surface of the depression;
   (c) providing a first conductive portion on the inside of the insulating layer only at a bottom of the depression;
   (d) forming a second conductive portion on the inside of the insulating layer and over the first conductive portion, being of a different material from the first conductive portion; and
   (e) exposing the first conductive portion from a second surface of the semiconductor substrate opposite to the first surface.

2. The method of manufacturing a semiconductor device as defined in claim 1,
   wherein the step (e) includes polishing the second surface of the semiconductor substrate.

3. The method of manufacturing a semiconductor device as defined in claim 1,
   wherein the second surface is etched so that the first conductive portion projects in the step (e).

4. The method of manufacturing a semiconductor device as defined in claim 1, wherein:
   the first conductive portion is less easily oxidized than the second conductive portion.

5. The method of manufacturing a semiconductor device as defined in claim 4,
   wherein the first conductive portion is formed of gold, and at least a center portion of the second conductive portion is formed of copper.

6. The method of manufacturing a semiconductor device as defined in claim 1,
   wherein the material of the first conductive portion is put in the depression by an ink jet method in the step (c).

7. The method of manufacturing a semiconductor device as defined in claim 1, wherein:
   the semiconductor substrate is a semiconductor wafer having a plurality of the integrated circuits, the depression being formed for each of the integrated circuits; and
   the method further comprising cutting the semiconductor substrate.

8. A method of manufacturing a semiconductor device comprising:
   (a) forming a depression from a first surface of a semiconductor wafer, the semiconductor wafer having a plurality of integrated circuits, the depression being formed for each of the integrated circuits;
   (b) providing an insulating layer on an inner surface of the depression;
   (c) providing a first conductive portion on the inside of the insulating layer;
   (d) forming a second conductive portion on the inside of the insulating layer and over the first conductive portion, being of a different material from the first conductive portion; and
   (e) exposing the first conductive portion from a second surface of the semiconductor wafer opposite to the first surface; and
   (f) cutting the semiconductor wafer,
   wherein the step of cutting the semiconductor wafer includes:
   forming a groove in the first surface, along a cutting line of the semiconductor wafer; and
   removing a bottom portion of the groove from the second surface so that the groove becomes a slit.

9. The method of manufacturing a semiconductor device as defined in claim 8,
   wherein the groove is formed by cutting.

10. The method of manufacturing a semiconductor device as defined in claim 8,
    wherein the groove is formed by etching.

11. The method of manufacturing a semiconductor device as defined in claim 8,
    wherein the groove is formed in the same process as the depression in the step (a).

12. The method of manufacturing a semiconductor device as defined in claim 8, wherein:
    the step (e) includes polishing the second surface of the semiconductor wafer;
    the groove is formed to be deeper than the depression; and
    the bottom portion of the groove is removed by the polishing of the second surface of the semiconductor wafer.

13. The method of manufacturing a semiconductor device as defined in claim 8,
    wherein the insulating layer is provided also on the inner surface of the groove in the step (b).

14. The method of manufacturing a semiconductor device as defined in claim 13,
    wherein the step (e) includes:
    ($e_1$) etching the second surface of the semiconductor wafer with a first etchants, having characteristics such that the etching amount with respect to the semiconductor wafer is greater than the etching amount with respect to the insulating layer, to cause the first conductive portion to project while covered by the insulating layer; and
    ($e_2$) etching at least a part of the insulating layer formed on a bottom surface of the depression with a second etchants, having characteristics such that at least the insulating layer is etched without forming a residue on the first conductive portion, to expose the first conductive portion;
    wherein part of the insulating layer formed on the bottom portion of the groove is caused to project from the second surface in the step ($e_1$); and
    wherein the part of the insulating layer formed on the bottom portion of the groove is etched and removed by means of the second etchants in the step ($e_2$).

15. The method of manufacturing a semiconductor device as defined in claim 8,
    wherein the step of removing the bottom portion of the groove is carried out in a state that a material of the semiconductor wafer is exposed within the groove.

16. The method of manufacturing a semiconductor device as defined in claim 15, wherein the step (e) includes:

($e_1$) etching the second surface of the semiconductor wafer with a first etchants, having characteristics such that the etching amount with respect to the semiconductor wafer is greater than the etching amount with respect to the insulating layer, to cause the first conductive portion to project while covered by the insulating layer; and ($e_2$) etching at least a part of the insulating layer formed on a bottom surface of the depression with a second etchants, having characteristics such that at least the insulating layer is etched without forming a residue on the first conductive portion, to expose the first conductive portion; and wherein the bottom portion of the groove formed by a part of the semiconductor wafer is etched and removed by means of the first etchants in the step ($e_1$).

17. The method of manufacturing a semiconductor device as defined in claim 8, wherein the step of cutting the semiconductor wafer is carried out with a protective sheet adhered to the first surface of the semiconductor wafer, so that a plurality of semiconductor chips obtained by cutting do not fall apart.

18. The method of manufacturing a semiconductor device as defined in claim 8, wherein the groove is formed only in regions sectioning the semiconductor wafer into a plurality of semiconductor chips having the plurality of integrated circuits.

19. A method of manufacturing a semiconductor device, comprising:

laminating a plurality of semiconductor devices manufactured by the method as defined in claim 1; and making electrical connections between the semiconductor devices through the conductive portions.

20. A semiconductor device manufactured by the method as defined in claim 1.

21. A semiconductor device manufactured by the method as defined in claim 19.

22. A semiconductor device comprising:

a semiconductor substrate having an electrode which is electrically connected to an integrated circuit and provided on a first surface of the semiconductor substrate, and also having a penetrating hole;

an insulating layer provided on an inner surface of the penetrating hole; and first and second conductive portions laminated on the inside of the insulating layer in the thickness direction of the semiconductor substrate, wherein the first and second conductive portions are formed of different materials; and wherein the first conductive portion is exposed from a second surface of the semiconductor substrate opposite to the first surface the first conductive portion provided only on a top of the second conductive portion in a direction of an opening of the penetrating hole on the second surface.

23. The semiconductor device as defined in claim 22, wherein the first conductive portion projects from the second surface.

24. The semiconductor device as defined in claim 22, wherein the first conductive portion is less easily oxidized than the second conductive portion.

25. The semiconductor device as defined in claim 24, wherein the first conductive portion is formed of gold, and at least a center portion of the second conductive portion is formed of copper.

26. A semiconductor device comprising:

a plurality of the semiconductor devices as defined in claim 22, wherein the semiconductor devices are laminated, and electrical connection between the semiconductor devices is achieved through the conductive portions.

27. A circuit board on which is mounted the semiconductor device as defined in claim 20.

28. A circuit board on which is mounted the semiconductor device as defined in claim 21.

29. A circuit board on which is mounted the semiconductor device as defined in claims 22.

30. An electronic instrument having the semiconductor device as defined in claim 20.

31. An electronic instrument having the semiconductor device as defined in claim 21.

32. An electronic instrument having the semiconductor device as defined in claim 22.

* * * * *